(12) United States Patent
Kishimoto

(10) Patent No.: US 6,656,818 B1
(45) Date of Patent: Dec. 2, 2003

(54) MANUFACTURING PROCESS FOR SEMICONDUCTOR WAFER COMPRISING SURFACE GRINDING AND PLANARIZATION OR POLISHING

(75) Inventor: Jun Kishimoto, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/831,374

(22) PCT Filed: Sep. 12, 2000

(86) PCT No.: PCT/JP00/06203

§ 371 (c)(1),
(2), (4) Date: May 16, 2001

(87) PCT Pub. No.: WO01/22484

PCT Pub. Date: Mar. 29, 2001

(30) Foreign Application Priority Data

Sep. 20, 1999 (JP) .......................................... 11-264790

(51) Int. Cl.⁷ .......................... H01L 21/30; H01L 21/46
(52) U.S. Cl. ....................................... 438/459; 438/692
(58) Field of Search ................................. 438/692, 459, 438/712, 716

(56) References Cited

U.S. PATENT DOCUMENTS 5,816,895 A * 10/1998 Honda .......................... 451/41

OTHER PUBLICATIONS

Abstract of Japanese Patent Publication No. 04082664A; dated Mar. 16, 1992.
Abstract of Japanese Patent Publication No. 03208342A; dated Sep. 11, 1991.
Abstract of Japanese Patent Publication No. 02153528A; dated Jun. 13, 1990.
Abstract of Japanese Patent Publication No. 62107937A; dated May 19, 1987.
Abstract of Japanese Patent Publication No. 11309653A; dated Nov. 9, 1999.

* cited by examiner

Primary Examiner—W. David Coleman
(74) Attorney, Agent, or Firm—Arent Fox Kintner Plotkin & Kahn, PLLC

(57) ABSTRACT

Provided is a manufacturing process for a semiconductor wafer according to which semiconductor wafers each with higher flatness can be manufactured with good efficiency from a wafer work having passed through a surface grinding step by enabling restriction of reduction in flatness in the vicinity of the center and in the outer peripheral edge portion of a surface ground wafer at the lowest level possible, and correction of the reduction in flatness of both portions with ease to planarize in a planarization or polishing step. When a semiconductor wafer fixed on a chuck table is surface ground using a cup shaped grinding wheel, the semiconductor wafer is ground toward the center thereof such that the grinding wheel cuts into the semiconductor wafer at the outer peripheral edge thereof and moves away from the semiconductor wafer at the central portion thereof and the ground semiconductor wafer is planarized according to a PACE method.

9 Claims, 15 Drawing Sheets

(a) ROTATING DIRECTION OF WAFER IN CMP AS VIEWED FROM GROUND SURFACE SIDE (b) ROTATING DIRECTION OF WAFER IN CMP AS VIEWED FROM GROUND SURFACE SIDE (a)

(b)

(c)

(d)

(e)

(a)

(b)

(c)

(d)

(e)

(a)

(b)

(c)

(d)

(e)

(a)

(b)

(c)

(d)

(e)

MANUFACTURING PROCESS FOR SEMICONDUCTOR WAFER COMPRISING SURFACE GRINDING AND PLANARIZATION OR POLISHING

TECHNICAL FIELD

This invention relates to a manufacturing process for a semiconductor wafer (hereinafter also referred to as a "wafer") including surface grinding, followed by planarization or polishing.

BACKGROUND OF THE INVENTION

In a manufacturing process for a semiconductor wafer of this kind, a semiconductor wafer has been surface-ground according to a process described below, shown in FIG. 10(a)(b)(c) and thereafter, a single side surface or double side surfaces thereof are processed for planarization according to a CMP (Chemical Mechanical Polishing) method, or a PACE (Plasma Assisted Chemical Etching) method (for example, see JP 2565617) for purposes of removal of a work damage layer caused by the grinding, and improvements on flatness and smoothness.

(1) First, a chuck table 12 for fixing a semiconductor wafer W thereon rotates on its rotation axis 12a with a prescribed slight tilt angle θ to the rotation axis 14a of a rotary shaft 14 of a cup shaped grinding wheel (hereinafter also simply referred to as a "grinding wheel") 16. Then, the grinding wheel 16 in rotation moves down and is into contact with the chuck table 12 to grind the chuck table 12 (FIG. 10(a)), with the result that a grinding finished surface of the chuck table 12 assumes an outwardly extending circular cone surface having a vertical angle (180−2θ) with a vertex thereof being the rotation axis of the chuck table 12.

(2) Then, a semiconductor wafer W is fixed on the surface ground chuck table 12 and the chuck table 12 is forced to rotate (FIG. 10(b)).

(3) Furthermore, the grinding wheel 16 moves down to a surface of the semiconductor wafer W and is into contact with the 40 wafer W, thereby the wafer W being surface-ground (FIG. 10(c)).

In recent years, a trend that surface grinding, as a processing method to obtain higher flatness, is introduced into a wafer processing step has been increasingly enhanced due to the demand for higher flatness of a semiconductor wafer. In the surface-grinding step of the semiconductor wafer, as shown in FIG. 10(a) to (c), the grinding is performed such that the cup shaped grinding wheel 16 cuts into the wafer W at an outer peripheral edge thereof and moves away from the wafer at a central portion, wherein the grinding proceeds while the grinding wheel 16 keeps in contact with the wafer over a length corresponding to a radius of the wafer W.

As schematically shown in FIG. 11, a removal by grinding is low due to a surface slipping phenomenon from elasticity of the grinding wheel 16 at a start position for cutting in of the grinding wheel 16 in contacting the wafer as a work and as a result, a grinding finished surface comes to have a slight rise at the start position, while at terminating position for cutting, the grinding finished surface face comes to have a recess because a grinding removal increases due to rapid reduction in resistance to cutting. These rise and recess characteristic of a finished surface obtained by surface-grinding have been obstacles against manufacturing a wafer having higher flatness.

For example, in the case where surface-grinding is effected using a resinoid bonded cup shaped grinding wheel including diamond abrasive powder and furthermore, the grinding is performed toward the center of the wafer from an outer peripheral edge thereof, as was in the prior art, such that the grinding wheel cuts into the wafer at the outer peripheral edge thereof and moves away from the wafer at the center thereof, there occur a recess in the vicinity of the center of the surface-ground wafer, of the order of 2 to 10 mm in diameter and of the order of 0.2 to 0.5 μm in depth, and a rise of the same order as the recess in size in the outer peripheral edge portion thereof.

The surface-ground wafer proceeds into a planarization or polishing step to come next, where a work damage layer on the surface-ground surface of the wafer caused by the surface-grinding is removed and the above described rise and recess portions are corrected to achieve increased flatness and enhanced smoothness.

In a polishing method using a polishing cloth, that is a CMP method, which is currently a main stream as a planarization or polishing method, the polishing cloth is made of a soft material, therefore, there is a tendency that a polishing surface of the cloth follows geometric features of a to-be-polished surface of a work and as a result, a polishing action is exercised to even a recess portion in the vicinity of the center of the wafer, therefore, correction of the recess portion is hard to be effected. In contrast to this, a polishing action is easy to act at a rise portion occurring locally in the outer peripheral edge portion, therefore, a rise in the outer peripheral edge portion is corrected.

On the other hand, in a PACE method newly developed for planarization, stock can be removed from a to-be-ground surface locally to a prescribed depth by an etching action of a plasma; therefore, a surface material is removed from part other than the recess portion, whereby flatness all over the surface can be improved.

The invention has been made in light of the above described prior art problem and it is accordingly an object of the invention to provide a manufacturing process for a semiconductor wafer capable of manufacturing the semiconductor wafer having higher flatness efficiently from a wafer work having passed through a surface grinding step by suppressing the above-noted reductions in flatness occurring in the vicinity of the center of the wafer work and in the outer peripheral edge portion thereof as much as possible and further, enabling correction of the reductions in flatness for planarization in a planarization or polishing step with ease.

DISCLOSURE OF THE INVENTION

In order to solve the above problem, a first aspect of the invention is directed to a manufacturing process for a semiconductor wafer wherein when the semiconductor wafer is surface ground using a cup shaped grinding wheel, the semiconductor wafer is ground toward the center thereof such that the cup shaped grinding wheel cuts into the semiconductor wafer at an outer peripheral edge thereof and moves away from the semiconductor wafer at a central portion thereof and the ground semiconductor wafer is planarized according to a PACE method.

That is, since in a surface grinding operation, the grinding wheel cuts into the semiconductor wafer at the outer peripheral edge portion and moves away from the semiconductor wafer at the central portion, there occur a rise in the outer peripheral edge portion of a finish surface of the wafer after the grinding and a recess in the central portion thereof. However, by use of the PACE method, there is corrected the recess in the central portion of the wafer, which in the prior art was difficult to be corrected by means of a method for polishing the wafer using a CMP method after the surface grinding, thereby enabling manufacture of a polished wafer having higher flatness.

A surface of the semiconductor wafer which has been planarized using the PACE method has very fine rises and recesses thereon remaining after the planarization; therefore, it is desirable to improve flatness and smoothness of the surface by further polishing the surface using a CMP method.

A method to force the grinding wheel to cut into the semiconductor wafer at the outer peripheral edge thereof can be performed such that rotation directions of the semiconductor wafer and the grinding wheel can be either of the same sense as each other or of the opposite senses from each other.

A chuck table, as described above, has a finished surface of a slightly inclined circular cone whose vertex is on the rotation axis of the chuck table. The wafer is held on the chuck table and surface grinding is performed so as to act over a radius of the wafer surface while holding a state of the wafer in which a central portion of a to-be-ground surface of the wafer slightly protrudes from a plane including a grinding surface of the grinding wheel; therefore, an angle a formed between the rotation axis of the rotary shaft of the grinding wheel and the rotation axis of the chuck table is necessary to be adjusted according to whether rotation directions of the semiconductor wafer, that is the chuck table, and the grinding wheel are the same sense as each other, or the opposite sense from each other.

That is, as shown in FIG. 5, in the case where rotation directions of the grinding wheel and the chuck table are the same sense as each other, the rotation axis of the chuck table has to be inclined by θ along a clockwise direction, as shown in the figure, to the rotation axis of the rotary shaft of the grinding wheel, while to the contrary, in the case of FIG. 6 where rotation directions of the grinding wheel and the chuck table are opposite from each other, the rotation axis of the chuck table has to be inclined by θ along a counterclockwise direction to the rotation axis of the rotary shaft of the grinding wheel, whereby grinding can be performed such that the grinding wheel is cut into the wafer at the outer peripheral edge portion and moves away from the wafer at the central portion.

A second aspect of the present invention is directed to a manufacturing process for a semiconductor wafer wherein when the semiconductor wafer is surface ground using a cup shaped grinding wheel, the semiconductor wafer is ground toward the outer periphery thereof such that the cup shaped grinding wheel cuts into the semiconductor wafer at the center thereof and moves away from the semiconductor wafer at an outer peripheral edge thereof and the thus ground semiconductor wafer is planarized by means of a CMP method.

That is, in this case, since when the semiconductor wafer is surface ground, the grinding wheel cuts into the semiconductor wafer at the center thereof and moves away from the semiconductor wafer at an outer peripheral edge portion thereof, there occur a rise in the central portion of the grinding finished surface of the wafer and sag in the outer peripheral edge portion. Hence, in this case, since the rise in the central portion can be corrected by a polishing action of the CMP method with ease, the prior art problem is solved and thus a wafer having high flatness all over the polishing finished surface thereof can be manufactured. Note that since the wafer rotates about a rotation axis passing substantially through the center of a ground surface being held by a chuck, a peripheral velocity due to rotation thereof is larger at a point on the ground surface closer to the outer periphery; therefore, a contact time of the ground surface of the wafer per unit area of the surface with the grinding wheel in the outer peripheral edge portion is shorter and accordingly an edge sag in the outer peripheral edge portion due to grinding is relatively small. Since in a CMP method the surface of a polishing cloth deforms in conformity with geometrical features of the ground surface of the wafer, an edge sag in the outer peripheral edge portion of the polished surface of the wafer has almost no difference in dimension from that under a polishing action of a normal CMP method.

A method to force the grinding wheel to cut into the semiconductor wafer at the center thereof can be performed such that rotation directions of the semiconductor wafer and the grinding wheel can be either of the same sense as each other or of the opposite senses from each other.

In order that the grinding wheel cuts into the wafer at the center thereof and moves away from the wafer at the outer peripheral portion thereof, it is necessary to adjust an angle θ of the rotation axis of the chuck table to the rotation axis of the rotary shaft of the grinding wheel according to whether rotation directions of the chuck table and the grinding wheel is of the same sense or of the opposite senses. The purpose can be achieved such that in the case of the same sense the rotation axis of the chuck table is, as shown in FIG. 7, inclined counterclockwise by θ relative to the rotation axis of the rotary shaft of the grinding wheel, while on the other hand, in the case of the opposite senses the rotation axis of the chuck table is, as shown in FIG. 8, inclined clockwise by θ relative to the rotation axis of the rotary shaft of the grinding wheel.

Moreover, it has been found that in order that, as is in a method of the invention, a wafer with extremely high flatness is manufactured with good efficiency by combining surface grinding with a planarization or polishing method following the surface grinding, there is a preferable combination between a cutting-in position on the chuck table by the grinding wheel when a chuck surface of the chuck table is surface ground in advance of surface grinding of the wafer and a cutting-in position on the wafer of the grinding wheel when the wafer is surface ground.

That is, when the chuck surface is ground to slightly form a circular cone surface by surface grinding of the chuck table in advance on which the semiconductor wafer is fixed as well, there occur a small rise in the vicinity of a cutting-in position of the grinding wheel on the chuck surface after the surface grinding and a recess in the vicinity of a position at which the grinding wheel moves away from the chuck table. Therefore, when the grinding wheel cuts into the wafer at the outer peripheral edge portion and moves away from the wafer at the central portion thereof in a surface grinding operation of the wafer, it is preferable that in a surface grinding operation of the chuck table, the grinding wheel, likewise, cuts into the chuck table at the outer peripheral edge portion thereof and moves away therefrom at the central portion thereof (FIG. 12(a)).

That is, in this case, as shown in FIG. 12(b), there occur a small rise on a circular cone surface in the outer peripheral edge portion of the chuck table and a recess in the vicinity of the vertex of the circular cone, which is the center of the chuck table; therefore, when a wafer is fixed on such a chuck table, a to-be-ground surface of the wafer comes to have a recess corresponding to that in the central portion of the chuck table, while having a small rise in the outer peripheral edge portion of the to-be-ground surface of the wafer corresponding to the rise in the outer peripheral edge portion of the chuck surface of the chuck table (FIG. 12(c)).

When the wafer held in this state is ground after the grinding wheel cuts into the wafer at the outer peripheral edge portion thereof as described above (FIG. 12(d)), the wafer ends up with grinding finish in a state where there occur a small rise in the outer peripheral edge portion and a recess in the central portion of the wafer as held on the chuck table, with the result that thicknesses in the outer peripheral edge portion and the central portion of the wafer are almost the same as those in the other portions; therefore, the wafer retains a high level of flatness in a state after the wafer is separated from the chuck table (FIG. 12(e)) and correction in a following planarization or polishing step is thus effectively realized.

Contrary to this, in the case where a chuck table is ground similar to FIG. 12(a) (FIG. 13(a)) and there occur a small rise in the peripheral edge portion of the chuck table and a recess in the vicinity of the vertex of a circular cone, which is the center of the chuck table (FIG. 13(b)), a wafer is fixed on the chuck table (FIG. 13(c)), surface grinding of the wafer is performed such that the grinding wheel cuts into the wafer in rotation at the central portion thereof, proceeds toward the outer peripheral edge portion of the wafer in rotation and then, moves away from the wafer at the outer peripheral edge portion (FIG. 13(d)). In this case, a rise is observed in the central portion of the wafer even in a chucked state since a removal is less in the central portion of the wafer, while an edge sag is observed in the outer peripheral edge portion of the wafer even in the chucked state since an excessive removal occurs in the outer peripheral edge portion, with the result that the surface-ground wafer has a sectional profile in which degradation of flatness in the central portion and outer peripheral edge portion, as shown schematically in FIG. 13(e), is further exaggerated up to a state that the following planarization or polishing is unpreferably performed.

This leads as follows. When surface grinding of a wafer is performed such that a grinding wheel, likewise, cuts into the wafer at the central portion thereof and moves away from the wafer at the outer peripheral edge portion thereof (FIG. 14(d)), surface grinding is preferably applied to a chuck surface of the chuck table such that the grinding wheel, likewise, cuts into the chuck table at the central portion thereof and moves away from the chuck table at the outer peripheral edge portion thereof (FIG. 14(a)).

Note that as a cup shaped grinding wheel used in a surface grinding operation on the chuck table, a metal bonded grinding wheel is preferable and as a cup shaped grinding wheel used in a surface grinding operation on the wafer, a resinoid bonded grinding wheel or a vitrified grinding wheel is preferable.

The ground surface finished by surface grinding in such a way as described above has currently inevitably grinding striations thereon caused as shown in FIG. 9 by alterations in a contact state between an acting surface of the grinding wheel and a ground surface of a to-be-ground work in grinding affected by a tiny displacement or vibrations of a drive section in operation of an apparatus, flatness of an acting surface of a grinding wheel, distribution in particulate shape of abrasive powder and others.

In addition, it has been found in the course of development maturing to the invention that shapes of the grinding striations are related with polishing efficiency in CMP polishing performed later and a lifetime of a polishing cloth.

As shown schematically in FIGS. 9(a) and 9(b), each grinding striation is produced in a state that the grinding wheel 16 drawn with a broken line is put into contact with a wafer at a solid line portion thereof and grinds the surface of the wafer. A detailed study was conducted on a relationship between a shape of a grinding striation and grinding conditions providing good working efficiency, with the result that it is preferable that the semiconductor wafer is surface ground such that grinding striations produced on a ground surface of the semiconductor wafer each assumes a convex toward a direction of rotation of the semiconductor wafer in a following polishing step, along a circular arc line starting from the center of the ground surface and having an arbitrary radius.

That is, when grinding striations are produced on the ground surface of a wafer as shown in FIG. 9(a), which rotates by friction between the wafer and the polishing cloth in CMP, the direction of the rotation is preferably in the direction of an arrow as viewed from the to-be-ground surface, while in the case of FIG. 9(b) the rotation direction of the wafer is in the direction of an arrow as well, and it is preferable that the grinding striations each assumes a convex along a circular arc line starting from the center of the wafer and having an arbitrary radius.

In such a way, when grinding striations produced on a semiconductor wafer are each convex toward the rotation direction of the semiconductor wafer in a later coming polishing step, a resistance to polishing is less; therefore, vibrations of the wafer during polishing are on a small scale, leading to an advantage of a longer lifetime of a polishing cloth.

To the contrary, when grinding striations produced on a semiconductor wafer are each concave toward the rotation direction of the semiconductor wafer in a later coming polishing step, a resistance to polishing increases and the wafer vibrates vigorously during the polishing, resulting in an adverse influence on a lifetime of a polishing cloth.

BEST MODE FOR CARRYING OUT THE INVENTION

Description will be given of embodiments of the invention below based on FIGS. 1 to 8 and FIGS. 12 to 15 among the accompanying drawings and it is needless to say that various modifications or alterations of the embodiments may be possible as far as not departing from the technical concept of the invention.

FIGS. 1 to 4 are flow charts showing exemplary processes of first to fourth embodiments of a method of the invention. FIGS. 5 to 8 are explanatory diagrams showing steps of the exemplary processes of the first to fourth embodiments of a method of the invention. FIGS. 12 to 15 are explanatory diagrams showing steps of exemplary processes of fifth to eighth embodiments of a method of the invention.

Figure 1:
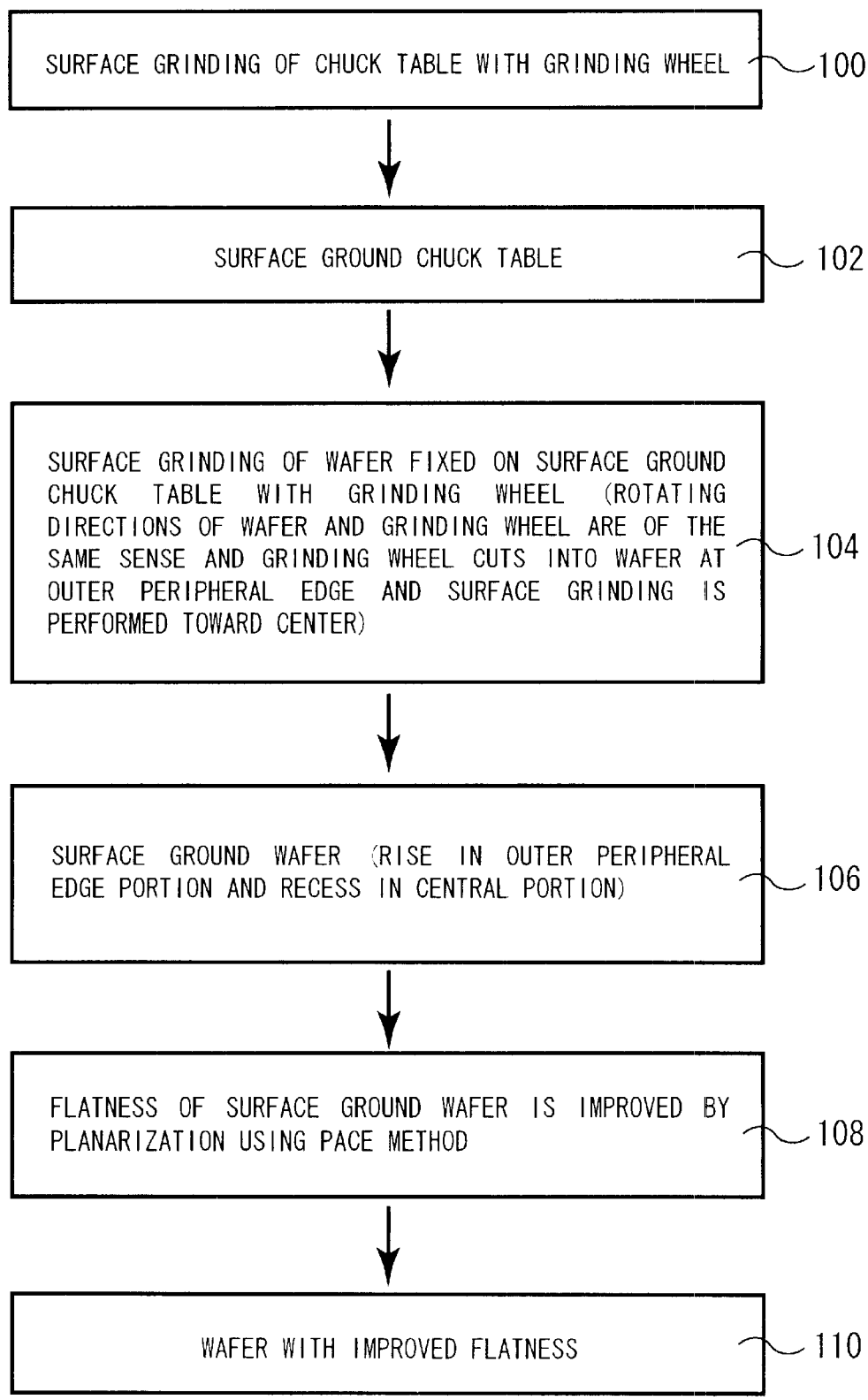
FIG. 1 is a flow chart showing an exemplary process of a first embodiment of the method of the invention.

In the first embodiment of the invention shown in FIG. 1, a chuck table 12 is surface ground by a cup shaped grinding wheel 16 as shown in FIG. 5(a) (the step 100 of FIG. 1) and the surface ground chuck table 12 is obtained (the step 102 of FIG. 1).

A wafer W is fixed on the surface ground chuck table 12 (FIG. 5(b)) and the grinding wheel 16 cuts into the wafer W at the outer peripheral edge portion and grinds the wafer toward the center thereof, thus performing surface grinding (the step 104 of FIG. 1 and FIG. 5(c)).

In the first embodiment, a grinding operation to cut into the wafer W from the outer peripheral edge portion toward the center thereof is performed by rotating the grinding wheel 16 and the chuck table 12, that is the wafer W in the same sense of direction in a state where the rotation axis 14a of the grinding wheel 16 and the rotation axis 12a of the chuck table 12 form an prescribed inclination of θ therebetween. The surface grinding is performed to a removal of the order of 1 to 50 μm in thickness on one side thereof.

The ground surface of the wafer having been surface-ground in the first embodiment has surface features thereon that there occur a rise in the outer peripheral edge portion of the wafer and a recess in the central portion thereof as the section thereof is shown schematically in FIG. 5(d)) (step 106 of FIG. 1 and FIG. 5(d)).

The wafer W surface ground in the first embodiment is applied in succession with a PACE method to planarize (the step 108 of FIG. 1) to obtain the wafer with improved flatness (the step 110 of FIG. 1).

Figure 2:
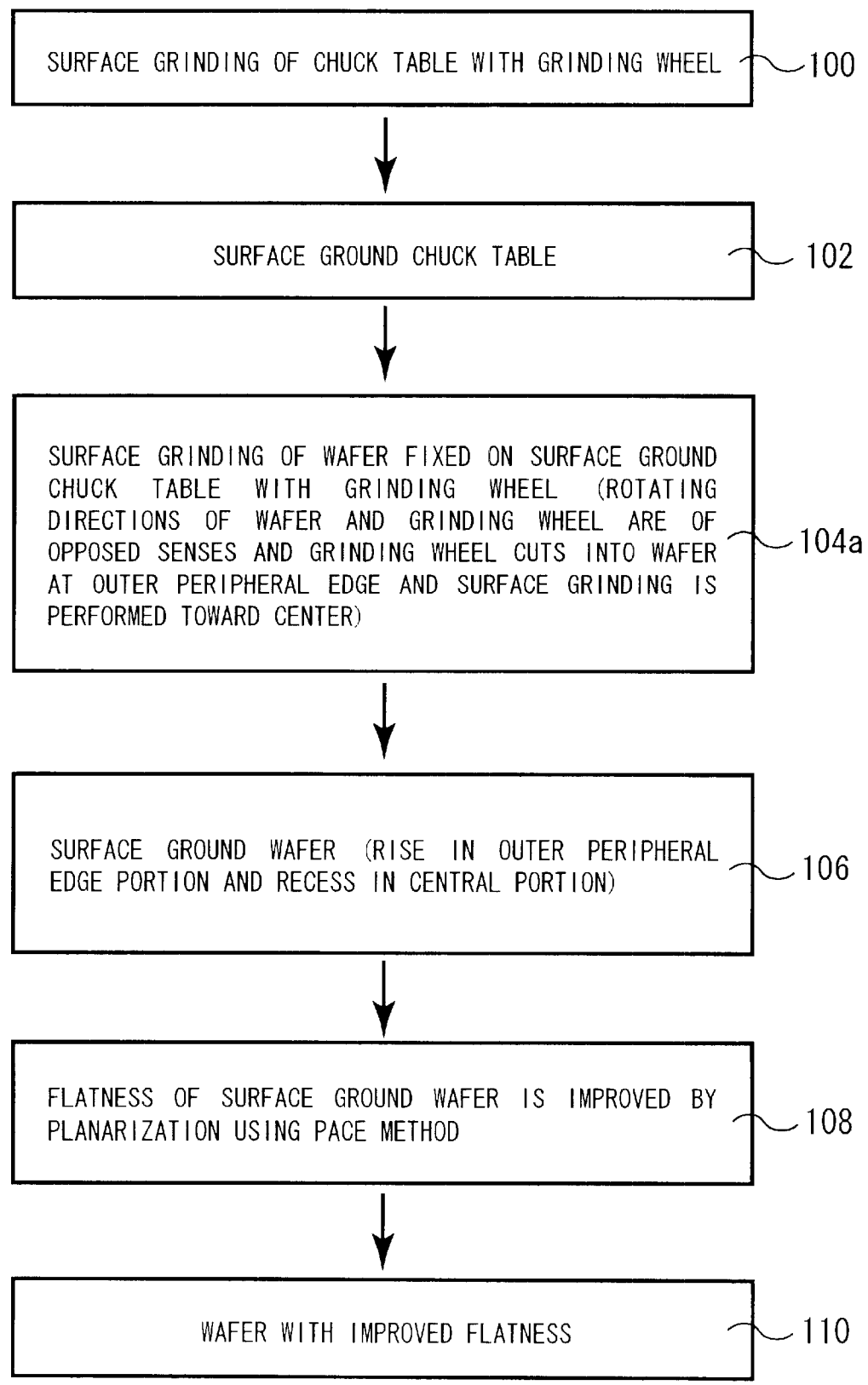
FIG. 2 is a flow chart showing an exemplary process of a second embodiment of the method of the invention.

A difference between the first embodiment and the second one of the invention shown in FIG. 2 is in that in step 104 of FIG. 1, a prescribed inclination of θ shown in FIG. 5(c) formed between the rotation axis 14a of the grinding wheel 16 and the rotation axis 12a of the chuck table 12 is replaced with an inclination −θ in the opposite direction, and the grinding wheel 16 and the chuck table 12, that is the wafer W rotate in opposite senses of rotating direction (the step 104a of FIG. 2, FIG. 6(c)) and the rest of the procedures are similar to each other.

A sectional shape of the ground surface of the surface ground wafer in the second embodiment has a recess similar to FIG. 5(d) (the step 106 of FIG. 2, FIG. 6(d)). Accordingly, by applying a PACE method to the wafer with a recess as in the case of the first embodiment, the wafer W with improved flatness can be obtained (the step 110 of FIG. 2).

Figure 12:
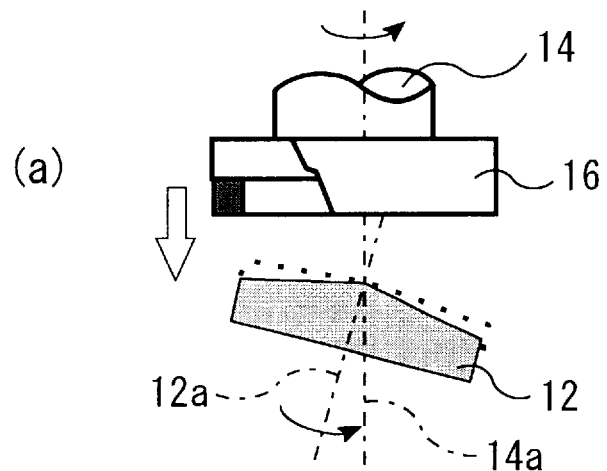
FIG. 12 is an explanatory diagram showing steps of an exemplary process of a fifth embodiment of a method of the invention.
Figure 12:
Figure 12:
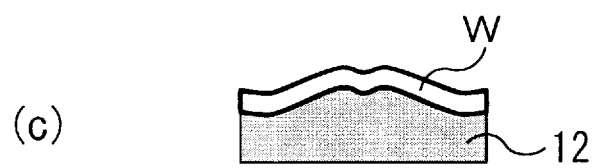
Figure 12:
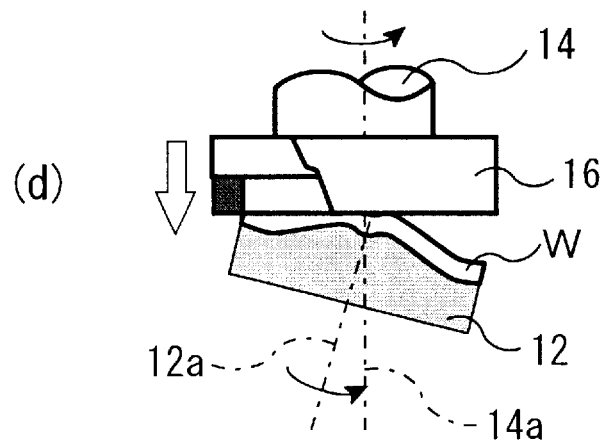
Figure 12:

FIG. 12 shows steps of an exemplary process of a fifth embodiment of a method of the invention. In the first and second embodiments as shown in FIG. 12 (a), surface grinding proceeds toward the center of the chuck table 12 such that the grinding wheel 16 cuts into the chuck table 12 at the outer peripheral edge thereof and moves away from the chuck table 12 at the center thereof in the surface grinding operation for the chuck table 12 (step 100 of FIGS. 1 and 2). Since, in this case, there occur a recess in the vicinity of the center of the chuck table 12 and a rise in the peripheral edge portion thereof (FIG. 12(b)), when a wafer W is surface ground using this chuck table (FIG. 12(c)(d)), there arises an advantage of flatness improvement in the outer peripheral edge portion and central portion of the wafer as described previously (FIG. 12(e)).

Figure 15:
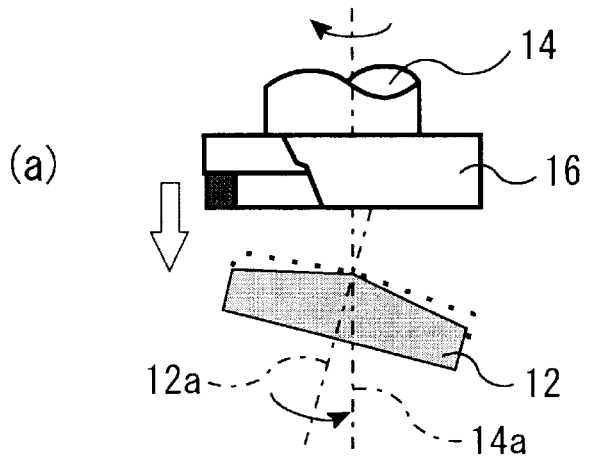
FIG. 15 is an explanatory diagram showing steps of an exemplary process of an eighth embodiment of a method of the invention.
Figure 15:
Figure 15:
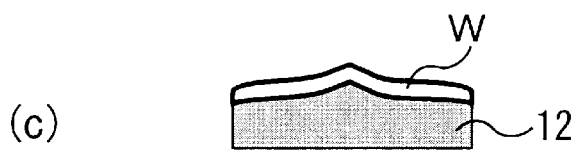
Figure 15:
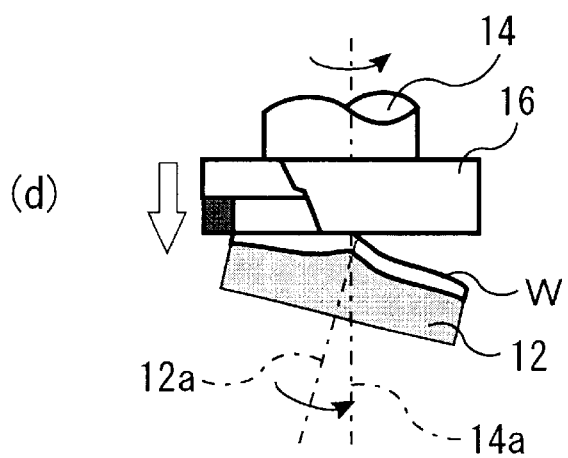
Figure 15:

FIG. 15 shows steps of an exemplary process of a eighth embodiment of a method of the invention. On the contrary, when surface grinding is performed toward the outer peripheral edge portion from the central portion on a chuck table such that a grinding wheel 16 cuts into the chuck table 12 at the center thereof and moves away from the chuck table 12 at the outer peripheral edge portion (FIG. 15(a)), there occur a rise in the vicinity of the center of the chuck table 12 and a sag in the outer peripheral edge portion (FIG. 15(b)); therefore, when a wafer W is surface ground using the chuck table 12 (FIG. 15(c)(d)), there arises a disadvantage that reduction in the flatness in the central portion and outer peripheral edge portion of the wafer W is further exaggerated (FIG. 15(e)). Note that even this wafer W can be a wafer of having improved flatness when the wafer W is planarized by applying a PACE method.

Figure 3:
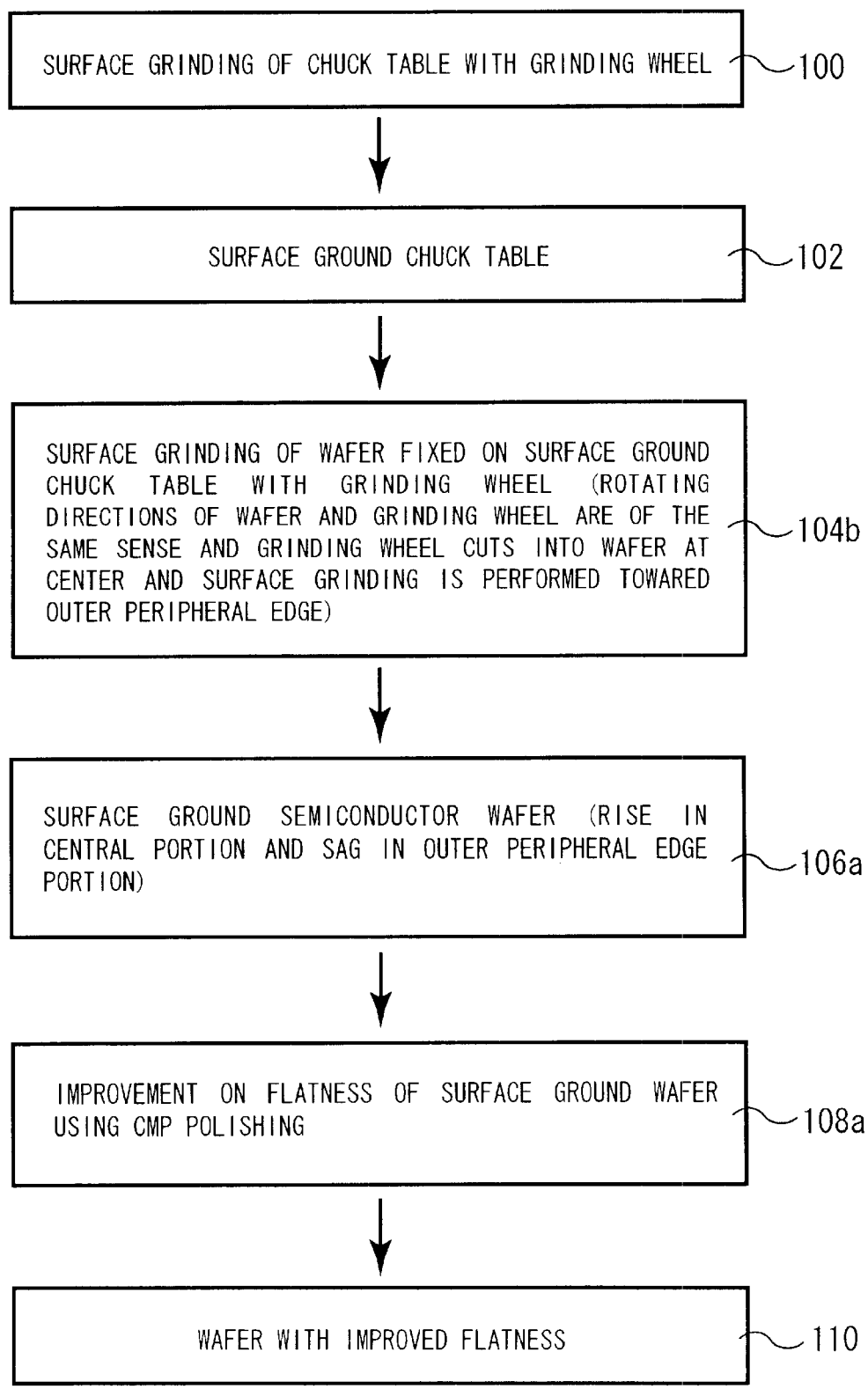
FIG. 3 is a flow chart showing an exemplary process of a third embodiment of the method of the invention.

In the third embodiment of the invention shown in FIG. 3, the wafer W is fixed on a surface ground chuck table 12 (FIG. 7(b)), and surface-grinding is performed such that the cup shaped grinding wheel 16 cuts into the wafer W at the center thereof to grind the wafer W toward the outer peripheral edge (the step 104b of FIG. 3 and FIG. 7(c)).

In this third embodiment, surface grinding is performed in a state that an angle of the rotation axis 12a of the chuck table 12 to the rotation axis 14a of the grinding wheel 16 is inclined by θ in the counterclockwise direction and the grinding wheel 16 and the chuck table 12, that is the wafer W, rotate in the same rotating direction.

The ground surface of the wafer W surface ground in the third embodiment has a rise produced in the vicinity of the center thereof and a sag produced in the outer peripheral edge portion thereof as the section thereof is shown schematically in FIG. 7(d) (the step 106a of FIG. 3 and FIG. 7(d)).

The ground surface of the wafer W surface ground in the third embodiment is applied in succession with a polishing method, that is a CMP method, suited for correcting and planarizing the rise (the step 108a of FIG. 3), thereby enabling achievement of the wafer with improved flatness (the step 110 of FIG. 3).

Figure 4:
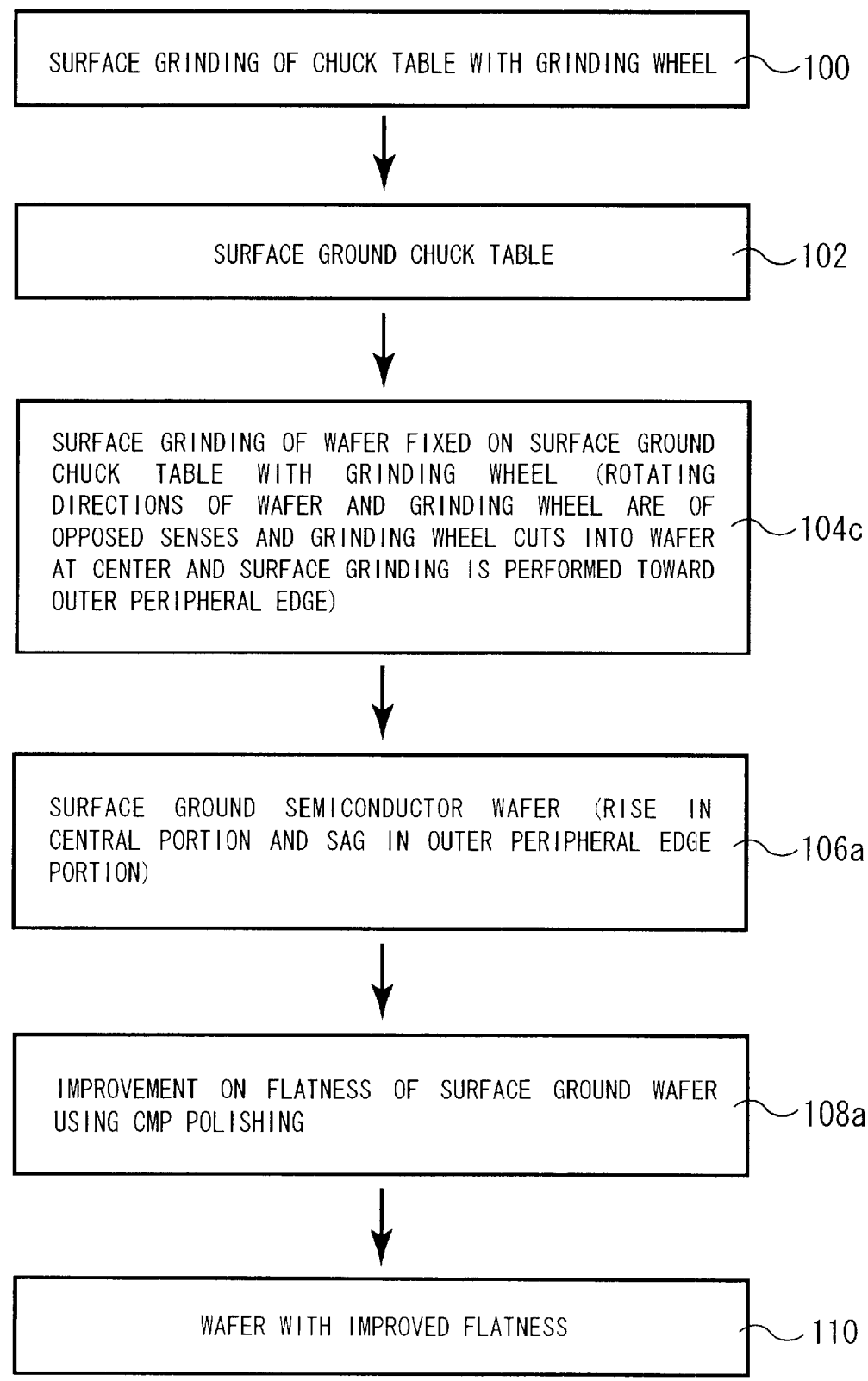
FIG. 4 is a flow chart showing an exemplary process of a fourth embodiment of the method of the invention.

A difference between the third embodiment shown in FIG. 3 and the fourth one shown in FIG. 4 is only in that in step 104b of FIG. 3, an angle formed between the rotation axis 12a of a rotary shaft of the chuck table 12 to the rotation axis 14a of the grinding wheel 16 is adjusted so as to be an inclination θ in the direction opposite to the prescribed inclination shown in FIG. 7(c) as well as the grinding wheel 16 and the chuck table 12, that is the wafer W rotate in opposite rotating directions (the step 104c of FIG. 4 and FIG. 8(c)) and both embodiments are similar to each other in the rest of the procedures.

The wafer W surface ground in the fourth embodiment has a rise in the vicinity of the center thereof similar to the case of FIG. 7(d)(the step 106a of FIG. 4 and FIG. 8(d)).

The wafer W surface ground in the fourth embodiment is also polished by CMP in the similar manner to the third embodiment (the step 108a of FIG. 4), thereby enabling achievement of the wafer with improved flatness (the step 110 of FIG. 4).

Figure 14:
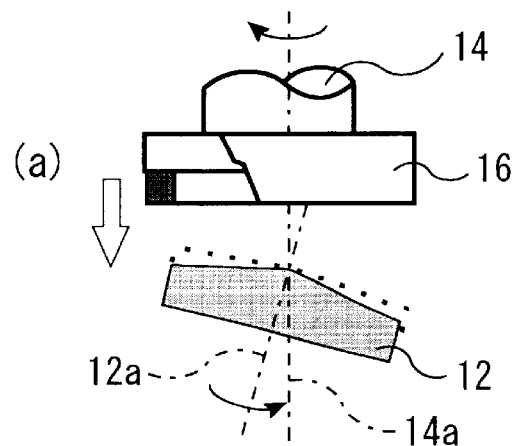
FIG. 14 is an explanatory diagram showing steps of an exemplary process of a seventh embodiment of a method of the invention.
Figure 14:
Figure 14:
Figure 14:
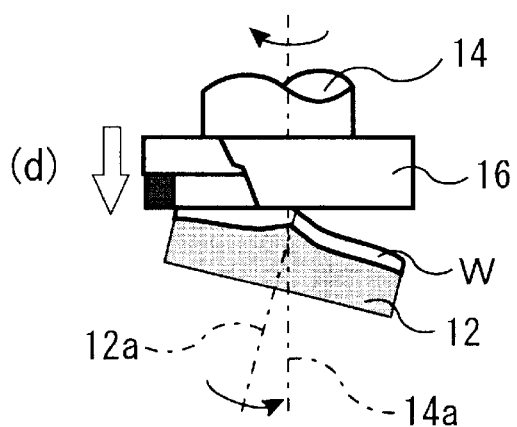
Figure 14:

FIG. 14 shows steps of an exemplary process of a seventh embodiment of a method of the invention. In the third and fourth embodiments as shown in FIG. 14(a), the chuck table 12 is ground and finished toward the outer peripheral edge thereof from the center thereof such that the grinding wheel 16 cuts into the chuck table 12 at the center thereof and moves away from the chuck table 12 at the outer peripheral edge portion thereof in a surface grinding operation of the chuck table 12 (the step 100 of FIGS. 3 and 4), and on the thus ground chuck table 12, there occur a rise in the vicinity of the center thereof and a sag in the outer peripheral edge portion thereof (FIG. 14(b)); therefore, when a wafer W is surface ground using this chuck table 12 (FIG. 14(c)(d)), an advantage is enjoyed in that a rise in the vicinity of the center of the ground wafer and a sag in the outer peripheral edge portion thereof are improved as described previously (FIG. 14(e)).

Figure 13:
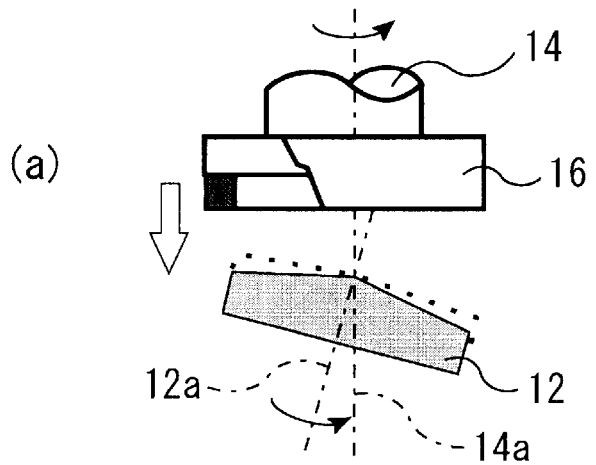
FIG. 13 is an explanatory diagram showing steps of an exemplary process of a sixth embodiment of a method of the invention.
Figure 13:
Figure 13:
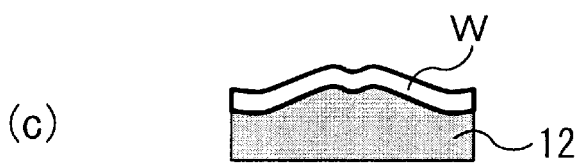
Figure 13:
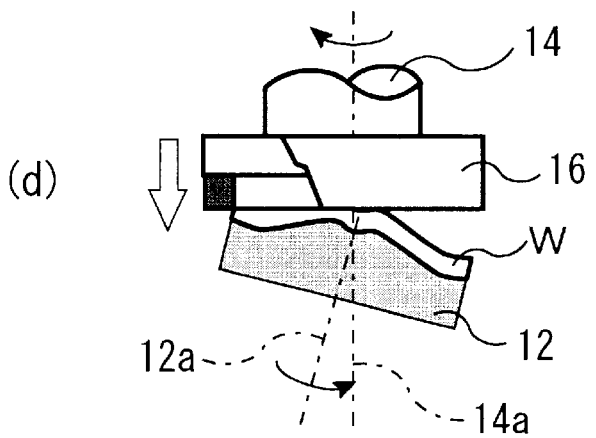
Figure 13:

FIG. 13 shows steps of an exemplary process of a sixth embodiment of a method of the invention. On the contrary, when the chuck table 12 is ground and finished toward the center thereof from the outer peripheral edge thereof such that the grinding wheel 16 cuts into the chuck table 12 at the outer peripheral edge portion thereof and moved away from the chuck table 12 at the center thereof (FIG. 13(a)), on the chuck table 12 there occur a recess in the vicinity of the center thereof and a rise in the outer peripheral edge portion thereof (FIG. 13(b)); therefore, when the wafer W is surface ground using this chuck table 12 (FIG. 13(c)(d)), there arises a disadvantage that reduction in the flatness in the vicinity of the center of the wafer W and in the outer peripheral edge portion is further exaggerated (FIG. 13(e)). Note that by applying CMP to this wafer W to polish as well, the wafer with improved flatness can be achieved.

Note again that when the chuck table 12 is in a state that the table 12 is suited for use in surface grinding of a wafer W by having been surface ground once, there may be no need for surface grinding of the chuck table 12 each time a wafer W is surface ground; therefore, the steps 100 and 102 are omitted in some cases.

While description will be given of the invention in a concrete manner below with reference to examples, needless to say that descriptions of the examples are shown by way of exemplification but should not be construed as any limitation on the invention. Note that while etched silicon wafers each of 300 mm in diameter were employed as specimen wafers in the following examples and comparative examples, it has been confirmed that results of the examples and comparative examples apply to etched silicon wafers each of 200 mm in diameter in a similar way.

EXAMPLE 1

Figure 5:
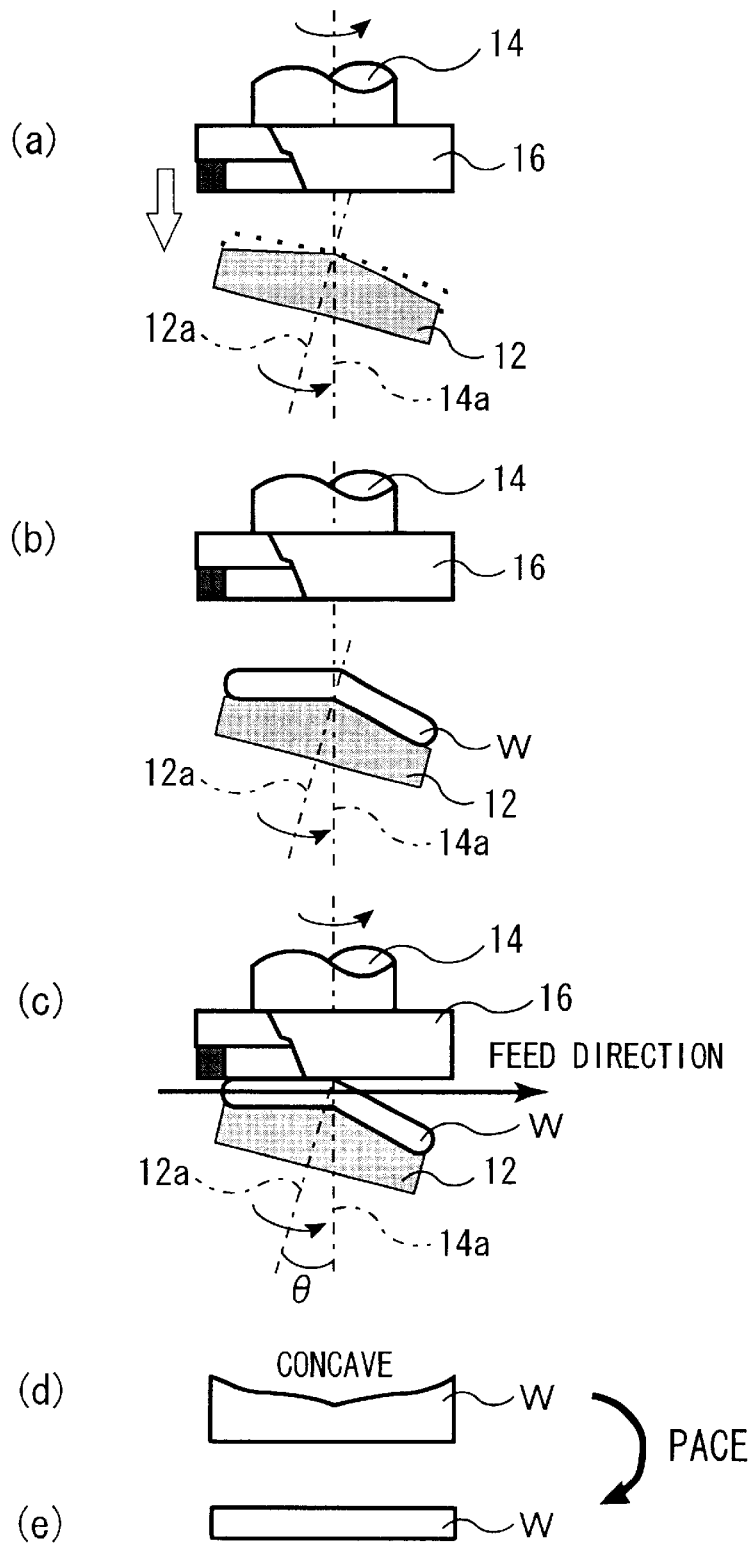
FIG. 5 is an explanatory diagram showing steps of an exemplary process of a first embodiment of a method of the invention.
Figure 6:
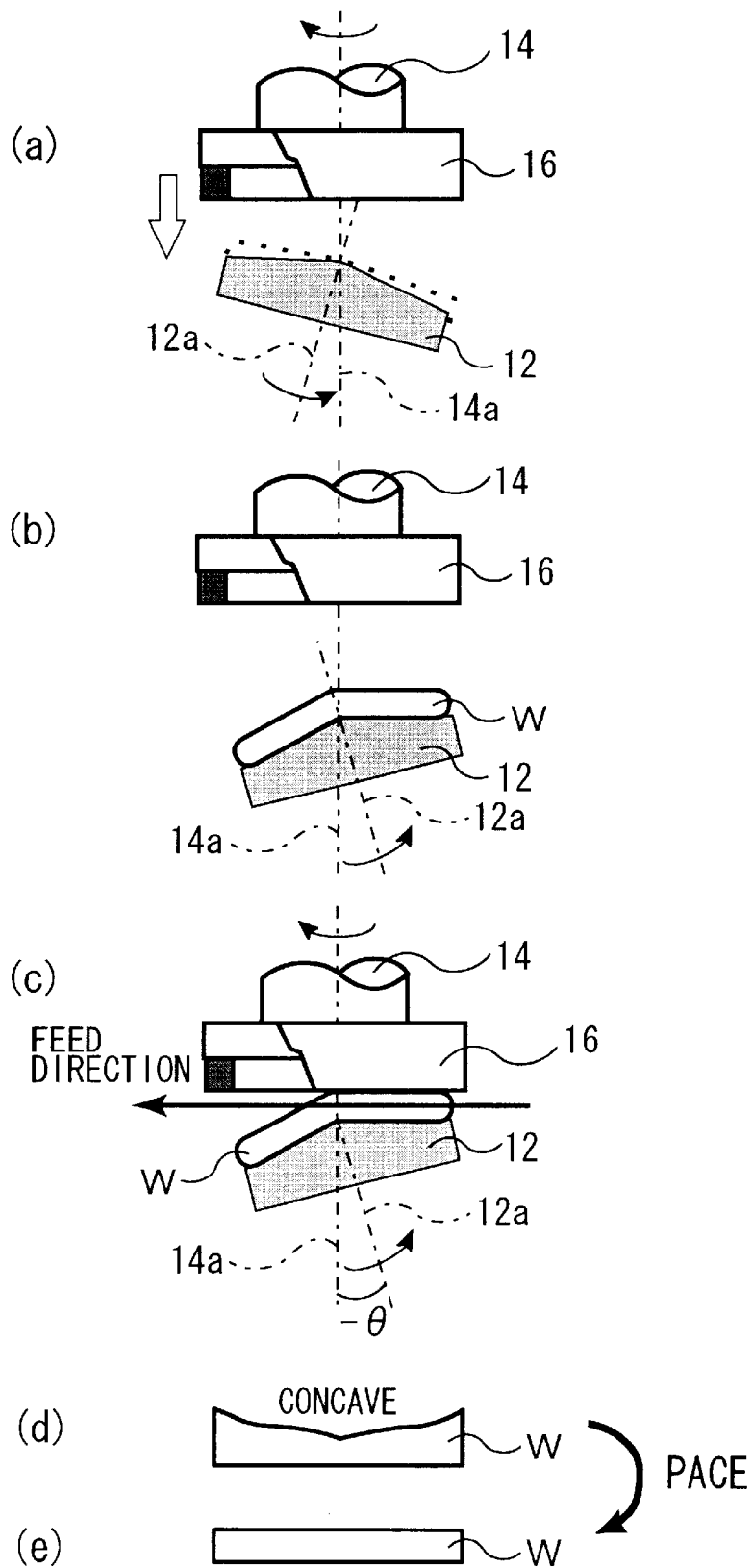
FIG. 6 is an explanatory diagram showing steps of an exemplary process of a second embodiment of a method of the invention.

Wafers W were surface ground according to the method shown in FIGS. 1 and 5. Grinding conditions this time are as follows. A chuck table was used of a type of a circular cone.

Grinding wheel: a resinoid bonded cup shaped grinding wheel using #2000 diamond abrasive powder, Peripheral velocity of the grinding wheel: 60 m/sec, Peripheral velocity of the wafer in rotation: 0.06 to 0.5 m/sec at the outer peripheral edge thereof, Rotating direction of the grinding wheel and the wafer: the same direction, Feed rate of the grinding wheel: 0.1 to 0.3 μm/sec.

Figure 9:
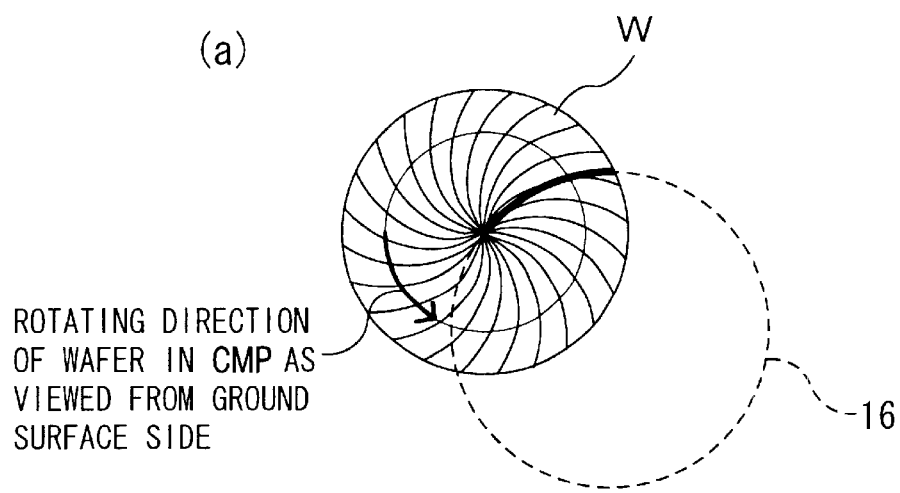
FIG. 9 shows patterns of grinding striations produced when a wafer is surface ground, (a) shows a case of surface grinding of a wafer in Examples 1 and 2, and (b) a case of surface grinding of a wafer in Example 3.
Figure 9:
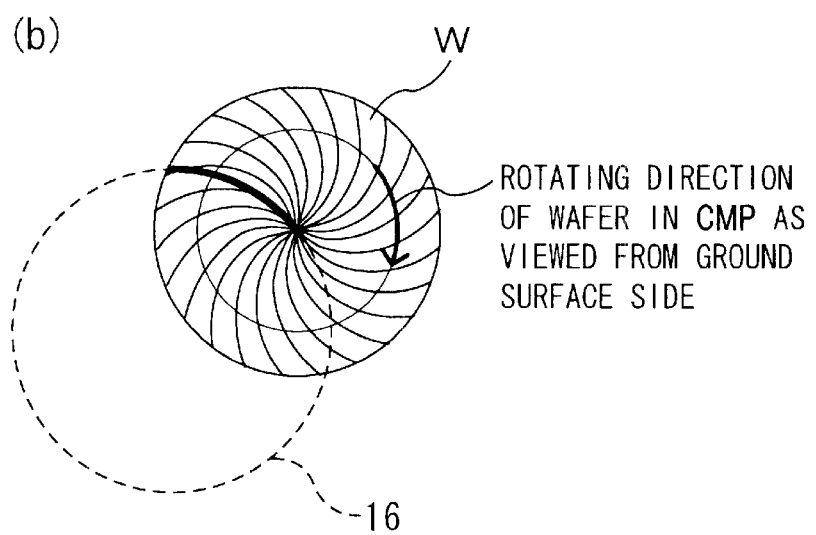
Figure 10:
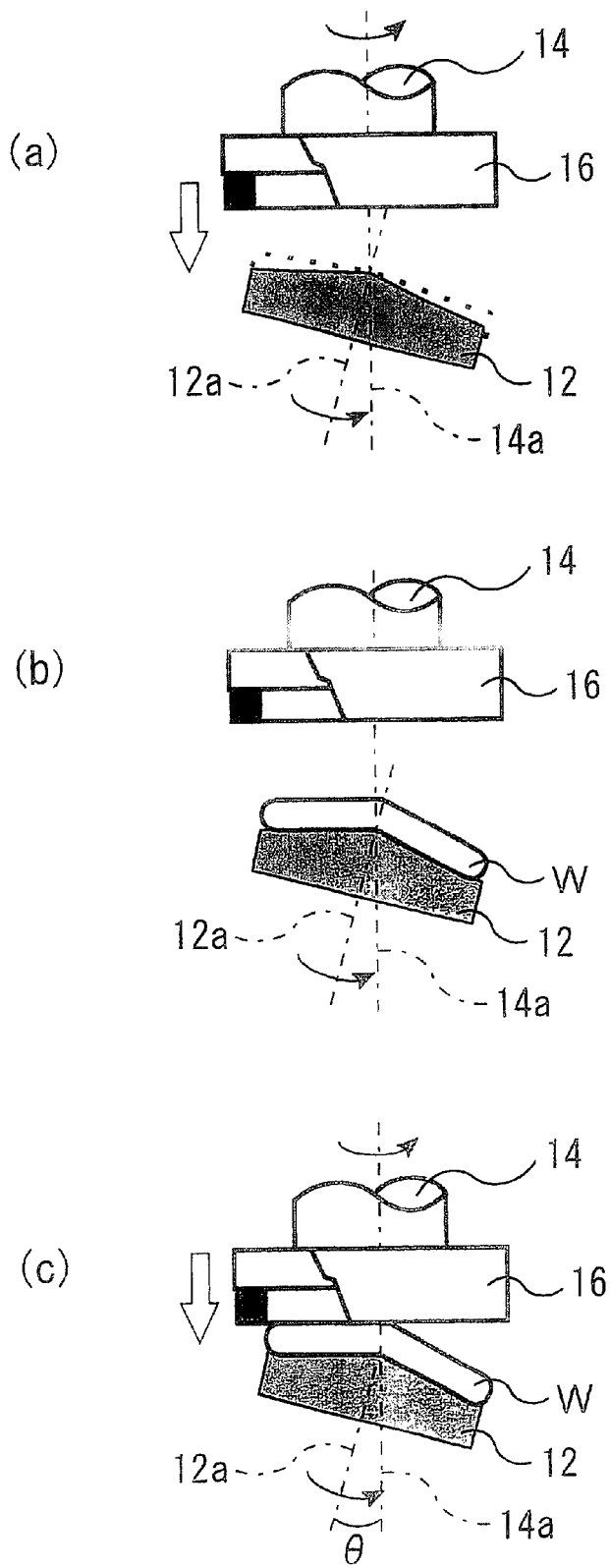
FIG. 10 is an explanatory diagram schematically showing steps of a prior art surface grinding method for a wafer according to a process flow thereof, (a) shows surface grinding on a chuck table, (b) fixing of a wafer on a surface ground chuck table and (c) surface grinding of a wafer.
Figure 11:
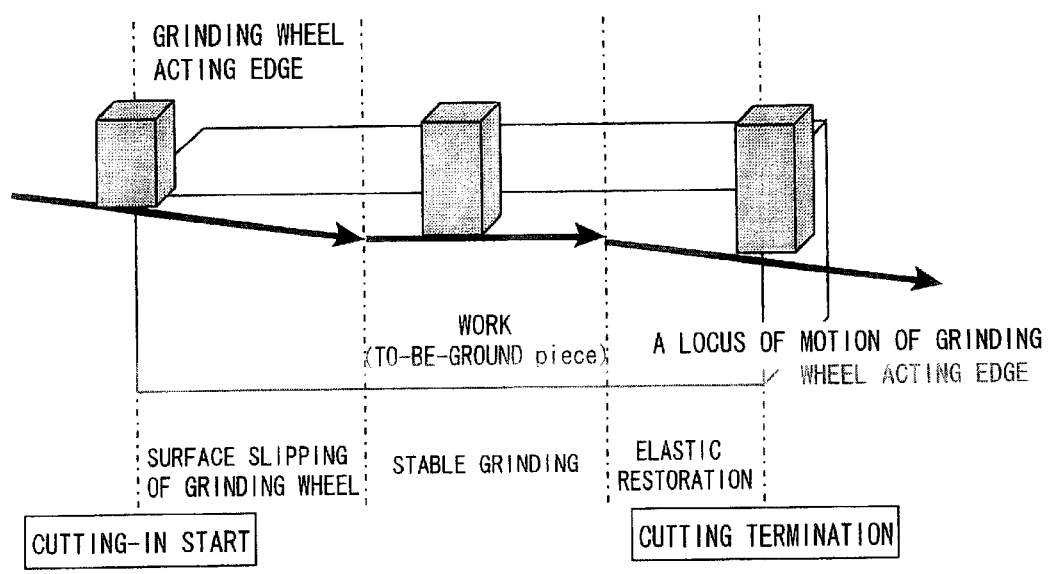
FIG. 11 is an explanatory diagram conceptually showing variations in grinding removal in a surface grinding operation for a work by a cup shaped grinding wheel.

In this method, the cup shaped grinding wheel 16 and each wafer W are put into contact with each other at the outer peripheral edge and the cup shaped grinding wheel cuts into the wafer W thereat. The grinding wheel 16 thus cut in is moved, while rotating, toward the center of the wafer and the cutting is completed at the center and moves away from the wafer thereat. Removals of the ground surfaces of the wafers W were in the range of 10 to 20 μm in thickness. Grinding striations of each wafer W surface ground according to the method of FIG. 5 were as shown in FIG. 9(a).

A flatness of each of the wafers W surface ground was measured using a measuring instrument of a capacitive sensing type (made by ADE Co., Model: Galaxy AFS 300) and as a result, a thickness variation across a wafer surface was 0.5 μm or less excluding the central portion and outer peripheral edge portion. Measured values of the recess were observed at 0.5 μm as the maximum depth in a circular area of 5 mm in radius from the center, while measured values of the rise were observed at 0.3 μm as the maximum height in an annular area of 5 mm in width inward from the outer peripheral edge. The wafers W were planarized with a PACE method (Plasma Assisted Chemical Etching: made by IPEC Precision, Inc., Model: PWS 300). The ground surface other than a recess in the central portion of each wafer W was removed by means of the PACE method by about 1 μm and a rise in the outer peripheral edge portion was also effectively removed, with the result that flatness of the wafer was globally improved and values of flatness SBIR (Site Backside Ideal Range, which is the same definition as LTV=Local Thickness Variation) in the vicinity of the center of each of the wafers W were in the range of 0.10 μm or less, which range was equal to that in a region other than an area in the vicinity of the center of each wafer. Note that the measurements of SBIR were performed in a cell size of 25 mm×25 mm with edge exclusion of 3 mm for each measurement including other examples and comparative examples.

COMPARATIVE EXAMPLE 1

Wafers W were surface grounded in the procedure similar to that of Example 1. There were observed a recess and a rise in the vicinity of the center and in the outer peripheral edge portion, respectively, of each wafer W. The wafers W were CMP polished by a stock removal of about 5 μm using a polishing cloth of a hard urethane type or a urethane-impregnated type. In this polishing step, a recess in the vicinity of the center of each wafer W was polished to the same extent as in the other area of the wafer; therefore, no correction was achieved on the recess after the polishing. As a result, a flatness in an area other than in the vicinity of the center of each wafer was 0.10 μm or less in SBIR, while a flatness in the vicinity of the center thereof fell in the range of 0.25 to 0.50 μm on each wafer.

EXAMPLE 2

Figure 8:
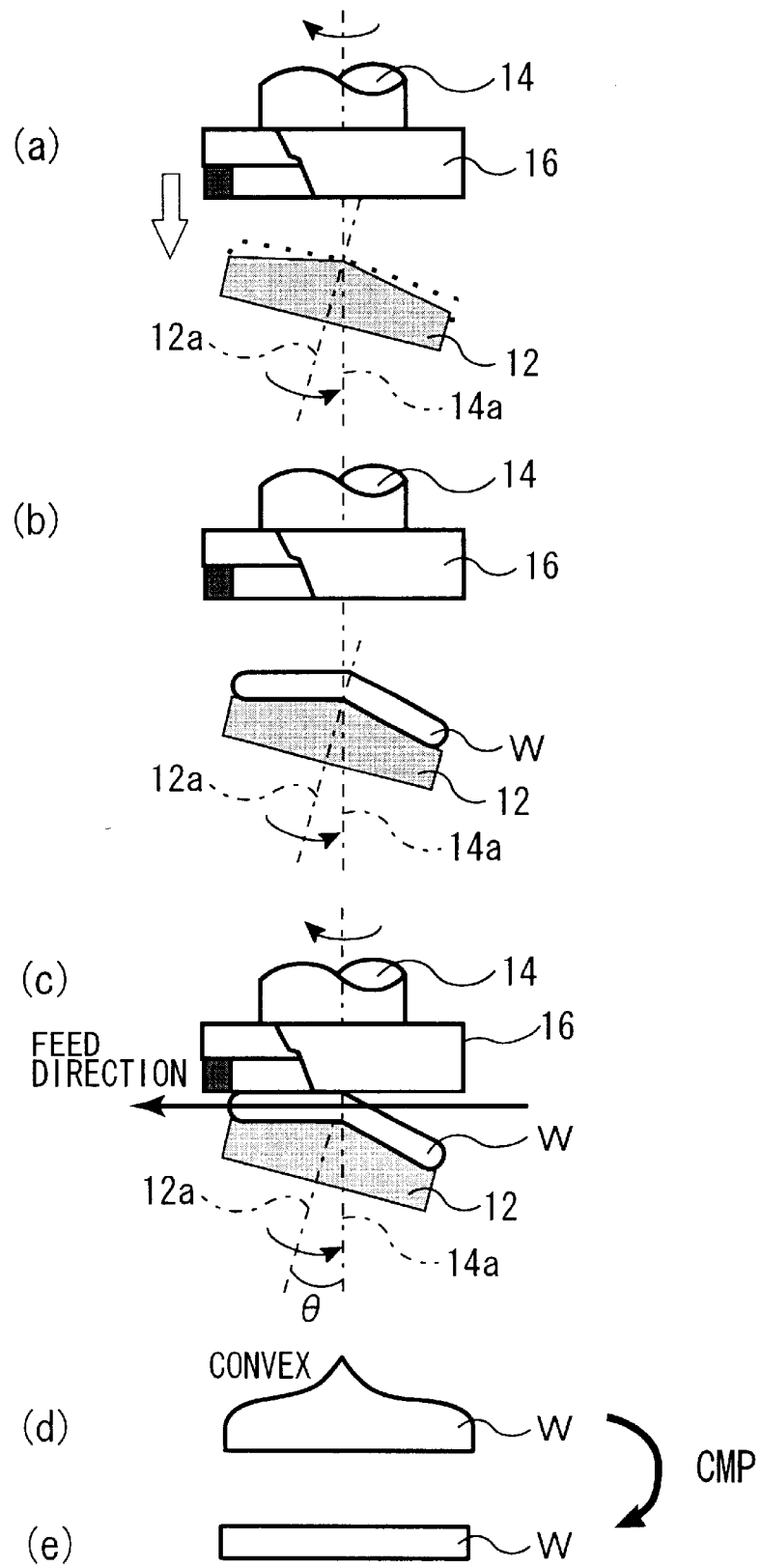
FIG. 8 is an explanatory diagram showing steps of an exemplary process of a fourth embodiment of the method of the invention.

Wafers were surface ground according to the method shown in FIGS. 4 and 8. Conditions for grinding are the same as in Example 1 with the exception that rotating directions of a grinding wheel and a wafer are opposite from each other. A chuck table was almost in the shape of a circular cone. In this method, a cup shaped grinding wheel 16 and a wafer W are put into contact with each other at the center of the wafer and the grinding wheel 16 cuts into the wafer thereat. The grinding wheel completed the cutting at the outer peripheral edge of each wafer and moves away from the wafer there. The ground surface of each wafer was ground off by 10 to 20 μm in thickness. Grinding striations on each wafer surface ground according to a method of FIGS. 4 and 8 were the same as shown in FIG. 9(a).

Flatness of each wafer W surface ground was measured and as a result, a thickness variation across each wafer surface was 0.5 μm or less except for the central portion and outer peripheral edge portion of the wafer. There were recognized on each wafer W a rise of 0.5 μm in height at the maximum in a circular area of a radius of about 5 mm from the center, and a sag of 0.3 μm in depth at the maximum in an annular area of 5 mm in width inward from the outer peripheral edge. Each of the wafers surface ground was CMP polished using a polishing cloth of a hard urethane type or a urethane impregnated type by a stock removal of about 5 μm and flatness was measured on each wafer, with the result that values of flatness SBIR in the vicinity of the center and the outer peripheral portion of each wafer were in the range of 0.10 μm or less, which range was almost equal to that in an area other than the vicinity of the center and the outer peripheral portion of each wafer.

EXAMPLE 3

Figure 7:
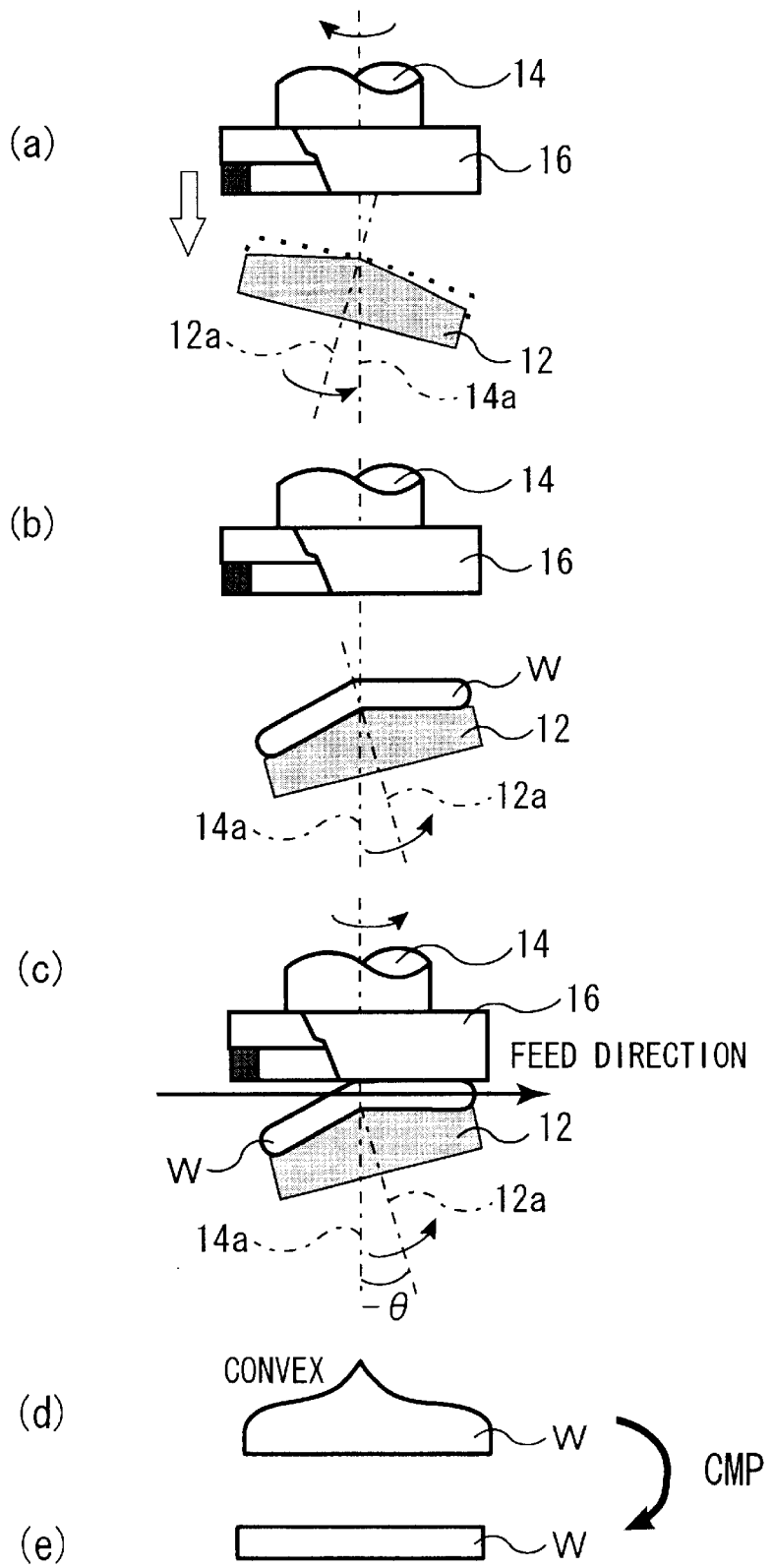
FIG. 7 is an explanatory diagram showing steps of an exemplary process of a third embodiment of a method of the invention.

As shown in FIG. 7, wafers W were surface ground such that the cup shaped grinding wheel 6 cuts into each wafer at the central portion thereof and moves away from the wafer at the outer peripheral edge portion thereof in conditions that the rotating direction of a cup shaped grinding wheel 16 was the same as in the case of FIG. 5, while an inclination of the rotation axis of the chuck table 12 to the rotation axis of the grinding wheel 16 is altered to the opposite directions from that in the case of FIG. 5. A chuck table in use was almost in the shape of a circular cone. The wafers W were a surface ground according to the method shown in FIGS. 3 and 7 and as a result, there was recognized on each wafer a characteristic rise in the vicinity of the center thereof (FIG. 7(d)) in the similar manner to the wafers W in Example 2 (according to the method of FIGS. 4 and 8). Grinding striations on each wafer W surface ground this time were as shown in FIG. 9(b). The wafers W surface ground in such a way were CMP polished by a stock removal of about 5 μm similar to Example 2 and as a result, each wafer achieved good flatness.

EXAMPLE 4

A chuck table 12 for use in fixing a semiconductor wafer thereon was surface ground according to the method shown in FIG. 12(a) using the cup shaped grinding wheel 16. In this method, the cup shaped grinding wheel 16 is put into contact with the outer peripheral edge of the chuck table 12 and cuts into the chuck table 12 thereat. The grinding wheel cut in is moved while rotating toward the center of the chuck table 12, the cutting is completed at the center thereof and the grinding wheel moves away from the chuck table 12 thereat. Conditions for the grinding at this time were as follows. Grinding wheel: a metal bonded cup shaped grinding wheel using #600 diamond abrasive powder, Peripheral velocity of the grinding wheel: 50 m/sec,
Speed of rotation of the chuck table: 0.6 m/sec at the outer peripheral edge,
Feed rate of the grinding wheel: 0.3 μm/sec,
Rotating direction of the grinding wheel and the chuck table: the same direction.

In this surface grinding, the chuck table 12 was finished so as to be in the shape of a slightly inclined circular cone with the center thereof as a vertex of the circular cone. The chuck table 12 was surface ground according to the method in FIG. 12(a) and on the conical surface, there were recognized a rise of 0.2 μm in height in an annular region of 5 mm in width inward from the outer peripheral edge of the chuck table 12 and a recess of about 0.5 μm in depth in a circular area with a radius of about 5 mm from the center of the chuck table 12 and in the vicinity of the vertex of the circular cone (FIG. 12(b)).

Each wafer was vacuum chucked on the chuck table (FIG. 12(c)) and the cup shaped grinding wheel 16 was put into contact with the outer peripheral edge and cuts into the wafer thereat; then, the wafer was surface ground in the conditions similar to those in Example 1 (FIG. 12(d)). The grinding wheel cut in was moved while rotating toward the center of the wafer, completed the cutting at the center of the wafer and then moves away from the wafer thereat. In this surface grinding, a resinoid bonded cup shaped grinding wheel was used as the cup shaped grinding wheel 16. All the wafers were surface grounded according to this method and as a result, extremely good flatness of 0.2 μm or less in GBIR (Global Back-side Ideal Range, which is the same definition as TTV=Total Thickness Variation) was obtained on each wafer (FIG. 12(e)).

EXAMPLE 5

A chuck table surface ground (FIG. 13(a)) similar to Example 4 was obtained (FIG. 13(b)). Each wafer was vacuum chucked on this chuck table (FIG. 13(c)) and ground in the conditions similar to those in Example 4 except that rotating directions of a grinding wheel 16 and the wafer were opposite from each other, wherein the cup shaped grinding wheel 16 was put into contact with the center of the wafer and cuts into the wafer thereat (FIG. 13(d)). The grinding wheel cut in was moved while rotating toward the outer peripheral edge of the wafer to complete the cutting thereat and moved away from the wafer there. In this surface grinding, a resinoid bonded cup shaped grinding wheel was used as the cup shaped grinding wheel 16. All the wafers were surface ground and as a result, on each wafer, there occurred an exaggerated rise as high as about 0.8 μm in height in the vicinity of the center of the wafer and an exaggerated sag in an annular area of about 5 mm in width inward from the outer peripheral edge thereof, a depth of which sag amounted to 0.6 μm. The wafers were CMP polished similar to Example 2 and good flatness was achieved on each of them.

EXAMPLE 6

A chuck table 12 on which a semiconductor wafer is fixed was surface ground using a cup shaped grinding wheel 16 according to the method shown in FIG. 14(a). Grinding conditions at this time were similar to those in Example 4 except that rotating directions of the grinding wheel and the chuck table were opposite from each other. In this method, the cup shaped grinding wheel 16 was put into contact with the chuck table 12 in the vicinity of the center thereof and cuts into the chuck table thereat. The grinding wheel cut in is moved while rotating toward the outer peripheral edge of the chuck table to complete the cutting at the outer peripheral edge thereof and moved away from the chuck table thereat. In this surface grinding, a metal bonded cup shaped grinding wheel was used as the cup shaped grinding wheel 16 and the chuck table 12 was shaped as a circular cone whose surface is inclined slightly from its original surface of the chuck table, the vertex of the cone being the center of the chuck table surface. On the chuck table 12 surface ground according to the method shown in FIG. 14(a), there occurred sag of about 0.2 μm in depth extending from the conical surface in an annual area of 5 mm in width inward from the outer peripheral edge of the chuck table 12 and a rise of about 0.5 μm in height in a circular area of about 5 mm in radius from the center thereof, the circular area being the central portion of the chuck table 12 in the vicinity of the vertex of the circular cone (FIG. 14(b)).

Each wafer was vacuum chucked on the chuck table (FIG. 14(c)) and ground in the conditions similar to those in Example 1 except that rotating directions of the grinding wheel and the wafer are opposite from each other, wherein the cup shaped grinding wheel 16 cuts into the wafer at the center thereof (FIG. 14(d)). The grinding wheel cut in was moved while rotating toward the outer peripheral edge of the wafer to complete the cutting at the outer peripheral edge and moved away from the wafer thereat. In this surface grinding, a resinoid bonded cup shaped grinding wheel was used as the cup shaped grinding wheel 16. All the wafers were surface ground and as a result, extremely good flatness equal to or less than 0.2 μm or less in GBIR (the same as TTV) was able to be obtained on each wafer (FIG. 14(e)).

EXAMPLE 7

A chuck table surface-ground (FIG. 15(a)) in the procedure similar to that of Example 6 was obtained (FIG. 15(b)). Each wafer was vacuum chucked on this chuck table (FIG. 15(c)) and ground in the conditions similar to those of Example 6 except that rotating directions of the grinding wheel and the wafer are of the same sense, wherein the cup shaped grinding wheel 16 was put into contact with the outer peripheral edge of the wafer and cut into the wafer thereat (FIG. 15(d)). The grinding wheel cut in was moved while rotating toward the center of the wafer to complete the cutting thereat and move away from the wafer thereat. In this surface grinding, a resinoid bonded cup shaped grinding wheel was used as the cup shaped grinding wheel 16. All the wafers were surface ground according to this method and as a result, on each wafer, there occurred an exaggerated recess (about 0.8 μm in depth) in the central portion thereof and a rise having an exaggerated profile of an upward slope with the top at the outer peripheral edge, as high as about 0.6 μm in height in the vicinity of the outer peripheral edge (FIG. 15(e)). Each wafer was planarized by means of the PACE method similar to that of Example 1, enabling achievement of good flatness on the wafer.

EXAMPLE 8

Each of surface ground wafers was CMP polished and polishing was performed such that a sense of rotating direction of the wafer was in a direction toward which grinding striations on the wafer are convex. A polishing cloth of a hard urethane type or a urethane impregnated type was used in the CMP. In this case, a resistance to polishing became smaller and vibrations of the wafer during polishing were less, with the result that a lifetime of the polishing cloth was longer than when etched wafers without surface grinding, produced in the prior art were polished by about 20%.

COMPARATIVE EXAMPLE 3

In a step where each surface ground wafer was CMP polished, the wafer was polished such that rotating direction of the wafer was in a direction toward which grinding striations on the wafer are concave. A polishing cloth of a hard urethane type or a urethane impregnated type was used. In this case, a resistance to polishing became larger and vibrations of the wafer during polishing were more, with the result that a lifetime of the polishing cloth was shorter compared with Example 8 by as large as 30 to 50%.

Capability of Exploitation in Industry

As described above, according to the invention, abnormalities in flatness occurring in the vicinity of the center and in the peripheral edge portion of a ground surface of a wafer are restricted at the possible lowest level and a planarization or polishing method suited for correcting such abnormalities in flatness is used to correct and planarize the wafer and thereby a large effect can be achieved that semiconductor wafers each with high flatness are manufactured with good efficiency.

What is claimed is:

1. A manufacturing process for a semiconductor wafer, comprising the following steps
   (a) surface grinding a semiconductor wafer fixed on a chuck table using a cup shaped grinding wheel, wherein the semiconductor wafer is ground toward the center thereof such that the cup shaped grinding wheel cuts into the semiconductor wafer at an outer peripheral edge thereof and moves away from the semiconductor wafer at a central portion thereof to obtain a around semiconductor wafer;
   (b) planarizing the around semiconductor water according to a PACE method; and
   (c) polishing the product of step (b) with a CMP method; wherein after the semiconductor wafer is ground toward the center thereof such that the cup shaped grinding wheel cuts into the semiconductor wafer at an outer peripheral edge thereof and moves away from the semiconductor wafer at a central portion thereof to obtain a ground semiconductor wafer, said ground semiconductor wafer has a concave ground surface before being planarized with the PACE method, said concave ground surface comprising a rise in an outer peripheral edge portion and a recess in a central portion.

2. A manufacturing, process for a semiconductor wafer as recited in claim 4, wherein the grinding wheel cuts into the semiconductor wafer at the center thereof by adjusting an angle formed between the rotation axis of the grinding wheel and the rotation axis of the chuck table.

3. A manufacturing process for a semiconductor wafer, comprising the following steps
   (a) surface grinding a semiconductor wafer using a cup shaped grinding wheel, wherein the semiconductor wafer is around toward the outer periphery thereof such that the cup shaped grinding wheel cuts into the semiconductor wafer at the center thereof and moves away from the semiconductor wafer at an outer peripheral edge thereof to obtain a around semiconductor wafer; and (b) planarizing the around semiconductor water by means of a CMP method;

wherein after the semiconductor wafer is ground toward the outer periphery thereof such that the cup shaped grinding wheel cuts into the semiconductor wafer at the center thereof and moves away from the semiconductor wafer at an outer periphery edge thereof to obtain a ground semiconductor wafer, said ground semiconductor wafer has a convex ground surface before being planarized with the CMP method, said convex ground surface comprising a rise in a central portion and a sag in an outer peripheral edge portion.

4. A manufacturing process for a semiconductor wafer as recited in claim 3, wherein the grinding wheel cuts into the semiconductor wafer at the center thereof while directions of rotation of the semiconductor wafer and the grinding wheel are of the same sense as each other.

5. A manufacturing process for a semiconductor wafer as recited in claim 3, wherein the grinding wheel cuts into the semiconductor wafer at the center thereof while directions of rotation of the semiconductor wafer and the grinding wheel are of the opposite senses from each other.

6. A manufacturing process for a semiconductor wafer as recited in claim 5, wherein the grinding wheel cuts into the semiconductor wafer at the center thereof by adjusting an angle formed between the rotation axis of the grinding wheel and the rotation axis of the chuck table.

7. A manufacturing process for a semiconductor wafer as recited in claim 3, wherein as the chuck table on which the semiconductor wafer is fixed, a chuck table is used that has been surface-grinding finished by grinding the chuck table toward an outer peripheral edge thereof using the cup shaped grinding wheel after forcing the cup shaped grinding wheel to cut into the chuck table at the center thereof.

8. A manufacturing process for a semiconductor wafer as recited in claim 3, wherein the semiconductor wafer is surface ground such that grinding striations produced on a ground surface of the semiconductor wafer each assumes a convex toward a direction of rotation of the semiconductor wafer in a following polishing step, along a circular arc line starting from the center of the ground surface and having an arbitrary radius.

9. A manufacturing process for a semiconductor wafer as recited in claim 3, wherein in a polishing step after the surface grinding, the semiconductor wafer is polished in a polishing apparatus while a convex direction of convex grinding striations produced on a ground surface of the semiconductor wafer, coincides with a rotation direction of the semiconductor wafer.

* * * * *